(12) United States Patent
Ishida et al.

(10) Patent No.: US 8,441,612 B2
(45) Date of Patent: May 14, 2013

(54) LED LIGHT SOURCE, ITS MANUFACTURING METHOD, AND LED-BASED PHOTOLITHOGRAPHY APPARATUS AND METHOD

(75) Inventors: Susumu Ishida, Yokohama (JP); Shohei Hata, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 422 days.

(21) Appl. No.: 12/815,222

(22) Filed: Jun. 14, 2010

(65) Prior Publication Data

US 2010/0328638 A1 Dec. 30, 2010

(30) Foreign Application Priority Data

Jun. 30, 2009 (JP) ................................ 2009-155179

(51) Int. Cl.
*G03B 27/54* (2006.01)
*H01L 21/00* (2006.01)
*H01L 33/00* (2010.01)

(52) U.S. Cl.
USPC .................................. 355/67; 438/28; 257/88

(58) Field of Classification Search .................... 355/53, 355/67; 438/28; 257/79, 88
See application file for complete search history.

(56) References Cited

U.S. PATENT DOCUMENTS

| 7,579,629 | B2 | 8/2009 | Inoguchi |
| 2004/0208210 | A1 | 10/2004 | Inoguchi |
| 2008/0099770 | A1* | 5/2008 | Mendendorp et al. .......... 257/79 |
| 2008/0169742 | A1 | 7/2008 | Lai |

FOREIGN PATENT DOCUMENTS

| JP | 62-147366 | 9/1987 |
| JP | 2004-311791 | 11/2004 |
| JP | 2005-136224 | 5/2005 |
| JP | 2006-250982 | 9/2006 |
| JP | 2008-172177 | 7/2008 |
| WO | WO 2006/004135 A1 | 1/2006 |
| WO | WO 2006-004135 A1 | 1/2006 |
| WO | WO 2008/093462 A1 | 8/2008 |

* cited by examiner

*Primary Examiner* — Peter B Kim
(74) *Attorney, Agent, or Firm* — Foley & Lardner LLP (57) ABSTRACT

This invention provides a structurally-simple LED light source that is capable of preventing temperature variations among its multiple LED elements arranged densely on its LED-mounting substrate and also improving the heat release capabilities of the substrate by comprising an LED light source with: a plurality of LED elements each of which is formed by connecting an LED chip to electrodes formed on a ceramic substrate; an LED-mounting substrate on which to mount the plurality of LED elements, the LED-mounting substrate having through holes therein; and a heat sink plate for releasing heat from the LED-mounting substrate, wherein a thermally conductive resin is present between the LED-mounting substrate and the heat sink plate and wherein part of the thermally conductive resin protrudes from the through holes of the LED-mounting substrate and covers the top surface of the LED-mounting substrate on which the plurality of LED elements are mounted, so that the part of the thermally conductive resin is in contact with the plurality of LED elements.

8 Claims, 7 Drawing Sheets

LED LIGHT SOURCE, ITS MANUFACTURING METHOD, AND LED-BASED PHOTOLITHOGRAPHY APPARATUS AND METHOD

CROSS-REFERENCE TO RELATED PATENT APPLICATIONS

Priority is claimed to Japan Priority Application 2009-155179, filed Jun. 30, 2009 including the specification, drawings, claims and abstract which are incorporated herein by reference in their entirety.

BACKGROUND OF THE INVENTION

Figure 5:
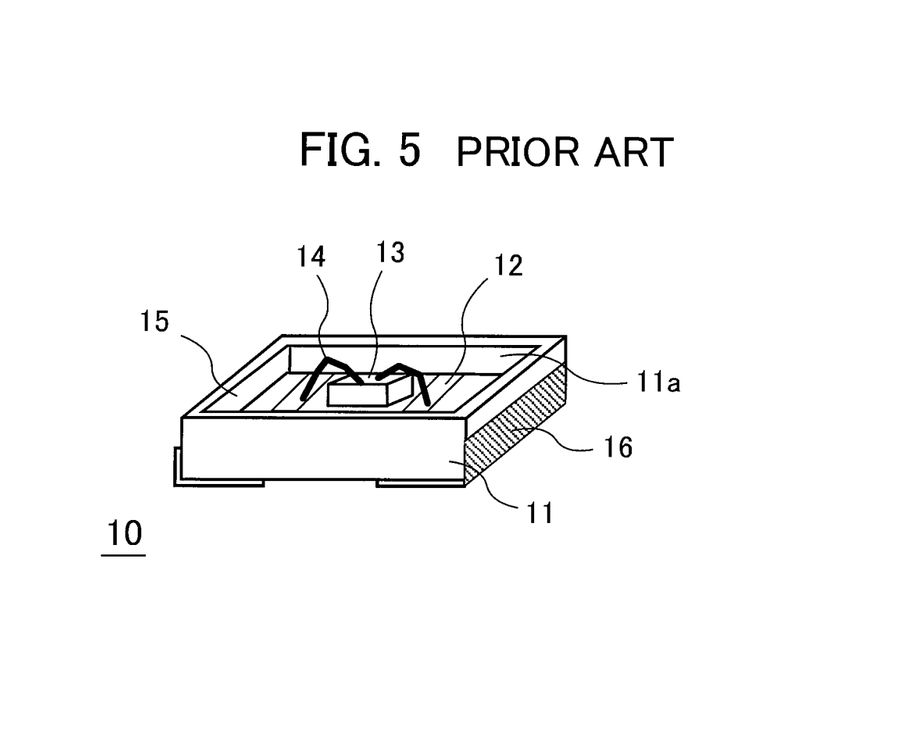
FIG. 5 is a perspective view of a conventional LED substrate.

As an example of a conventional LED (light-emitting diode) substrate, Japanese Unexamined Patent Application Publication No. 2004-311791 (Patent Document 1) discloses such an LED substrate as illustrated in FIG. 5.

The LED substrate 10 of FIG. 5 has a concave portion 11a formed on the top surface of its ceramic substrate 11. Conductive wiring patterns 12 are formed on the concave portion 11a, and a single LED chip 13 is glued to the conductive wiring patterns 12 with its bottom surface facing the concave portion 11a (the bottom surface of the LED chip 13 is the surface through which light is not emitted). The electrodes on the light-emitting-surface side of the LED chip 13 are connected by wires 14, made of gold or the like, to particular locations of the conductive wiring patterns 12 on the concave portion 11a of the ceramic substrate 11. The concave portion 11a is sealed with resin 15 (e.g., silicone resin), or inert gas such as nitrogen or the like is sealed inside the concave portion 11a. Part of the side faces and part of the bottom face of the ceramic substrate 11 are covered with outer terminals 16 so that the LED substrate 10 can be electrically connected to other external devices. Note that multiple LED chips 13 with different luminescent colors can also be mounted on the concave portion 11a in place of the single LED chip 13.

Figure 6:
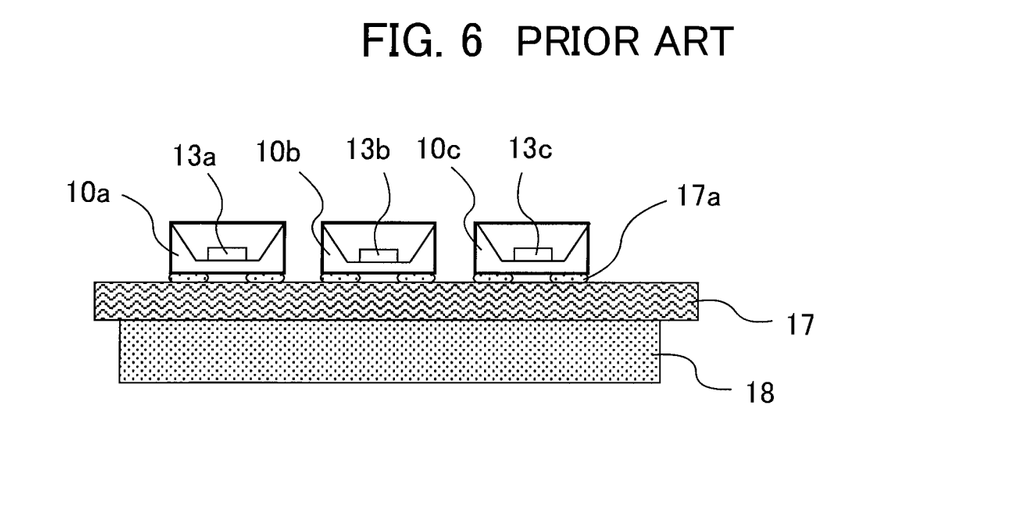
FIG. 6 is a cross section of a conventional LED light source.

As illustrated in FIG. 6, Patent Document 1 also discloses an LED light source that involves the use of multiple LED substrates 10, each of which is the one shown in FIG. 5. In this LED light source, the multiple LED substrates 10 are attached by solder 17a to the top surface of a substrate 17, made of glass epoxy resin or the like, in the form of a single or multiple rows. Also, an LED chip 13 (13a-13c) is mounted on each of the concave portions 11a-11c the LED substrates 10 with the bottom surfaces of the LED chips 13 facing the LED substrates 10.

Figure 7:
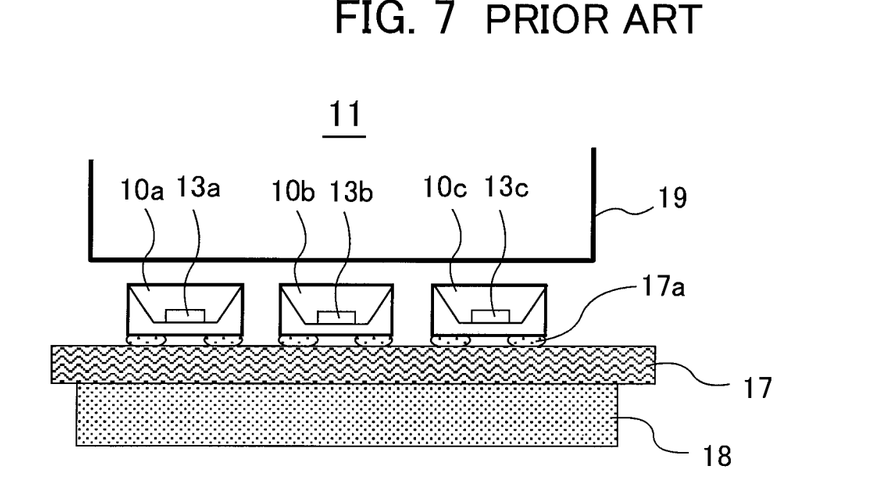
FIG. 7 is a cross section of a conventional LED backlight.

When the LED light source of Patent Document 1 is used for a photolithography apparatus or an illumination device, sufficient heat release is required because the LED light source is driven by a high electric current. Thus, as illustrated in FIG. 6, a heat sink plate 18 is attached to the bottom surface of the substrate 17, i.e., the surface opposite the surface to which the substrates 10 are attached. This LED light source is arranged, as illustrated in FIG. 7, across from a light guide plate 19 of a backlight so that the light from the LED substrates 10 can travel into the light guide plate 19.

Figure 8:
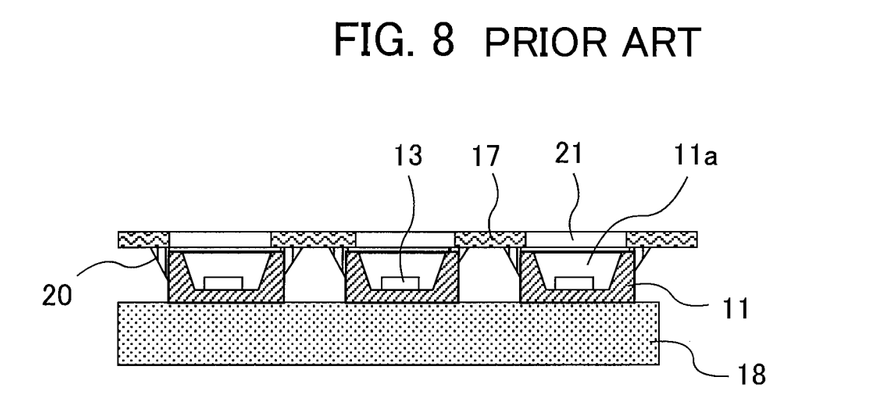
FIG. 8 is a cross section of another conventional LED light source.

As another heat release structure, Patent Document 1 also discloses such an LED light source structure as illustrated in FIG. 8. In this LED light source, an LED chip 13 is glued to the conductive wiring patterns on each of concave portions 11a of ceramic substrates 11, with the bottom surfaces of the LED chips 13 facing the concave portions 11a. Also, a heat sink plate 18 is glued directly to the bottom faces of the ceramic substrates 11, i.e., the surface opposite the light emitting surface of the ceramic substrate. This LED light source also has a substrate 17 placed on the ceramic substrates 11. The substrate 17 has windows 21 so that the light emitted from the ceramic substrates 11 can travel there through. The conductive wiring patterns on the substrate 17 (not illustrated) which are used for power supply to the LED chips 13 are connected by solder 20 to the conductive wiring patterns on the top surfaces of the ceramic substrates 11 (not illustrated).

The LED display device of Patent Document 1 that involves the use of such LED light sources as above is capable of releasing the heat of the LED chips 13 efficiently because the heat can be transferred to the heat sink plate 18 only through the ceramic substrates 11 and the adhesive that glues the LED chips 13 to the ceramic substrates 11.

Figure 9:
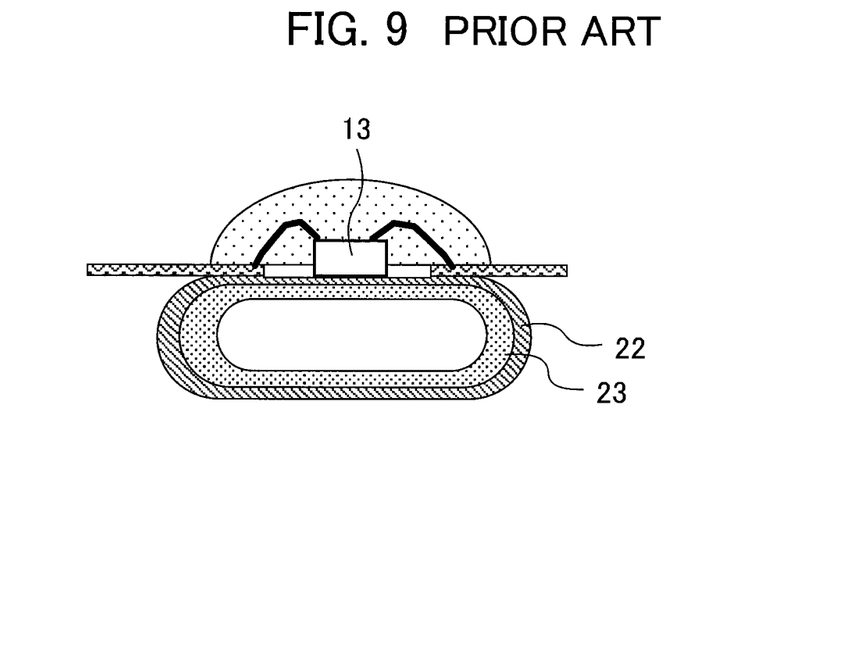
FIG. 9 is a cross section of still another conventional LED light source.

As a modification example of the LED substrate 10 of FIG. 5, Japanese Unexamined Patent Application Publication No. 2008-172177 (Patent Document 2) discloses, as illustrated in FIG. 9, a heat release structure in which a metal housing 22 the houses a liquid-to-vapor heat release device 23 is attached to the bottom surface of an LED chip 13, i.e., the surface opposite the light emitting surface of the chip 13.

In the heat release structure of Patent Document 2, the heat of the LED chip 13 can be quickly released through the metal housing 22 and the liquid-to-vapor heat release device 23, which is high in thermal conductivity. Thus, temperature rises of the LED chip 13 can be prevented.

Further, Japanese Unexamined Patent Application Publication No. 2006-250982 (Patent Document 3) discloses a maskless photolithography apparatus.

SUMMARY OF THE INVENTION

As stated above, in the LED light source of Patent Document 1 as illustrated in FIG. 5, the heat sink plate 18 is attached to the bottom surface of the substrate 17 on the top surface of which are mounted the multiple LED substrates 10. Thus, the heat of the LED chips 13 is transferred to the heat sink plate 18 through the ceramic substrates 11 of the LED substrates 10 and through the substrate 17.

Figure 10:
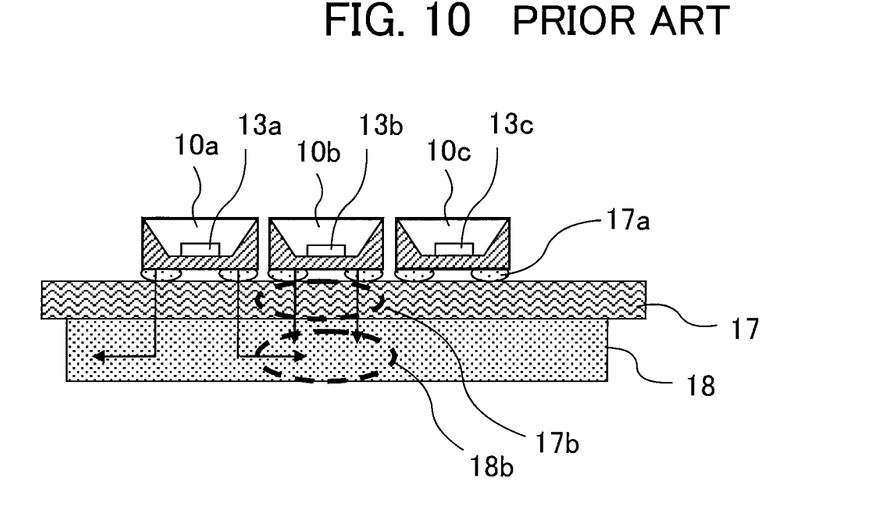
FIG. 10 is a cross section illustrating heat flows in a conventional LED light source.

If multiple LED substrates 10a, 10b, and 10c are closely arranged on the substrate 17 as illustrated in FIG. 10, the heat of an LED element of the LED substrate 10a located adjacent to the LED substrate 10b is transferred to the heat sink plate 18 through the solder 17a and through the substrate 17. This increases the temperature of a portion of the heat sink plate 18 which is located right below the LED substrate 10a, and that temperature is thus higher than those at the periphery of the heat sink plate 18.

The heat of the LED substrate 10b is also transferred to the heat sink plate 18 through the solder 17a and through the substrate 17. However, if the heat sink plate 18 is already raised in its temperature, the heat of the LED substrate 10b cannot be dispersed inside the heat sink plate 18 as with the heat of the LED substrate 10a. This will increase the temperatures of a substrate area 17b and a heat sink plate area 18b that are located below the LED substrate 10b. As a result, the temperature of the LED substrate 10b will also increase because the heat of the LED substrate 10b cannot be transferred sufficiently to the substrate 17. This results in the temperature difference between the LED substrates 10a and 10b as well as the temperature variations among the LED substrates 10a to 10c.

The LED temperature variations will increase as the heat of the LED chips 13 increases (e.g., when the LED light source is used for a photolithography apparatus or an illumination device which consumes a large amount of electric power). The LED temperature variations will also increase when the LED substrates 10a to 10c are more closely arranged on the substrate 17. When the temperature of the LED substrate 10a increases, the temperature of its LED chip 13a will also increase. A temperature increase of an LED chip causes its illumination efficiency and light intensity to decrease. When the LED chip is constantly subjected to a high-temperature environment, the LED chip will deteriorate faster, shortening its mechanical life. For these reasons, increased temperature variations among LED chips lead to adverse consequences such as light intensity decreases, light intensity variations, and shortened LED life.

While the LED display device of Patent Document 1 has the improved capabilities of transferring heat from its LED-mounting substrate to its heat sink plate, no consideration is given to LED temperature variations, making the LED display device susceptible to the LED temperature variations.

Those disclosed in Patent Document 2 are also susceptible to the LED temperature variations.

Patent Document 3 relates to a maskless photolithography apparatus that involves the use of a semiconductor laser or a discharge lamp such as a mercury lamp and a xenon lamp as its light source, but no mention is made of an LED light source.

To address the above problems, an object of the present invention is thus to provide a structurally-simple or easily-manufacturable LED light source that enables uniform illumination by reducing temperature variations among its LED elements arranged densely on its substrate and to provide an photolithography apparatus that involves the use of the LED light source.

To achieve the above object, an LED light source according to the invention comprises: a plurality of LED elements each of which is formed by connecting an LED chip to electrodes formed on a ceramic substrate; an LED-mounting substrate on which to mount the plurality of LED elements, the LED-mounting substrate having through holes therein; and a heat sink plate for releasing heat from the LED-mounting substrate, wherein a thermally conductive resin is present between the LED-mounting substrate and the heat sink plate and wherein part of the thermally conductive resin protrudes from the through holes of the LED-mounting substrate and covers the top surface of the LED-mounting substrate on which the plurality of LED elements are mounted, so that the part of the thermally conductive resin is in contact with the plurality of LED elements.

Moreover, a method for manufacturing an LED light source according to the invention comprises the steps of: applying a thermally conductive resin on a heat sink plate; pressing a bottom surface of an LED-mounting substrate on a top surface of which a plurality of LED elements are mounted against the heat sink plate on which the thermally conductive resin has been applied until the distance between the heat sink plate and the LED-mounting substrate becomes a particular value, so that the thermally conductive resin can spread between the heat sink plate and the LED-mounting substrate and so that part of the thermally conductive resin can flow from through holes of the LED-mounting substrate onto the top surface of the LED-mounting substrate so as to fill spaces between the plurality of LED elements; and heating the thermally conductive resin for solidification after the pressing step.

Further, an LED-based photolithography apparatus according to the invention comprises: a light source; a photolithography pattern generation unit for generating photolithography patterns; a table on which to place a workpiece, the table being movable at least in one direction; and a control unit for controlling the light source, the photolithography pattern generation unit, and the table, wherein the light source comprises: a plurality of LED elements each of which is formed by connecting an LED chip to electrodes formed on a ceramic substrate; an LED-mounting substrate on which to mount the plurality of LED elements, the LED-mounting substrate having through holes therein; and a heat sink plate for releasing heat from the LED-mounting substrate, the heat sink plate being attached by a thermally conductive resin to the LED-mounting substrate and wherein part of the thermally conductive resin protrudes from the through holes of the LED-mounting substrate and covers the top surface of the LED-mounting substrate on which the plurality of LED elements are mounted, so that the part of the thermally conductive resin is in contact with the plurality of LED elements.

Furthermore, an LED-based photolithography method according to the invention comprises the steps of: directing light emitted from a light source to a photolithography pattern generation unit; and exposing a workpiece on which a photoresist is applied to the light that has passed through a photolithography pattern generated by the photolithography pattern generation unit; wherein the light from the light source is emitted from a plurality of LED elements of the light source and wherein the plurality of LED elements are mounted on an LED-mounting substrate with a thermally conductive resin applied therebetween, and the LED-mounting substrate is cooled by a water-cooling jacket.

In accordance with the invention, it is possible to reduce temperature variations among multiple LED elements mounted on an LED-mounting substrate because the LED elements are connected to the LED-mounting substrate by thermally conductive resin. In addition, because the thermally conductive resin also connects a heat sink plate to the LED-mounting substrate, the heat of the LED-mounting substrate can be more efficiently transferred to the heat sink plate than in conventional technologies.

Moreover, the temperature variations can be reduced further when a ceramic or metal substrate higher in thermal conductivity is used as the LED-mounting substrate instead of using a conventional resin substrate. This reduces thermal stress on the LED elements which tend to become high in temperature, thereby enhancing the reliability of the LED elements.

Further, the above-described LED light source of the invention does not require a new manufacturing process and a new device because it can be manufactured by a conventional manufacturing process. Thus, manufacturing cost increases can be prevented.

Furthermore, application of the LED light source of the invention to a photolithography apparatus leads to less power consumption during light exposure.

DETAILED DESCRIPTION OF THE PREFERRED EMBODIMENTS

Embodiments of the present invention will now be described with reference to the accompanying drawings.

Embodiment 1

Figure 1:
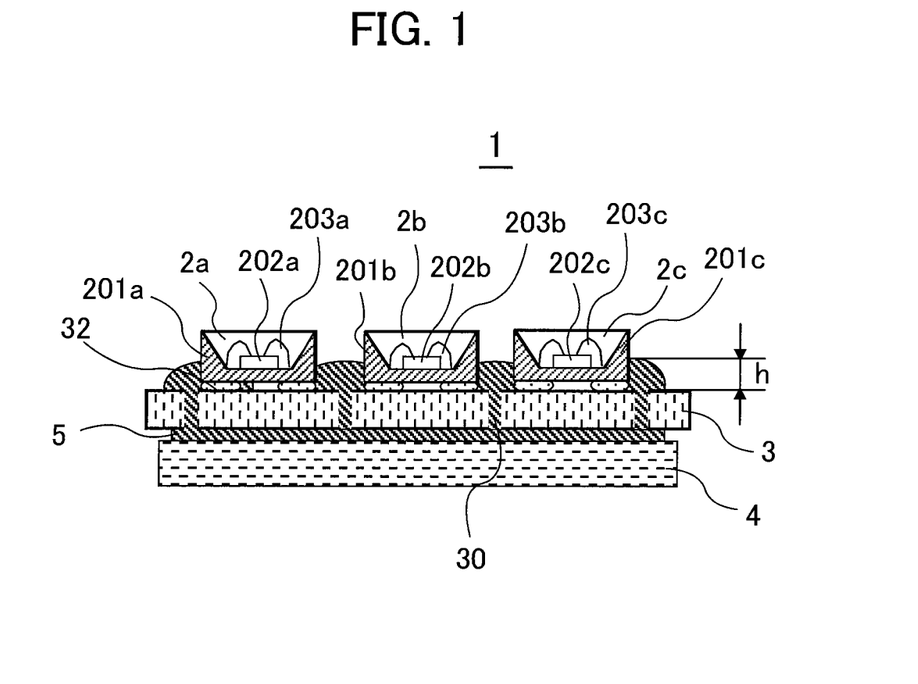
FIG. 1 is a cross section illustrating the structure of an LED light source according to Embodiment 1 of the invention.

FIG. 1 is a cross section of an LED light source according to Embodiment 1 of the invention. The LED light source 1 of FIG. 1 includes the following components: a substrate 3; multiple LED substrates 2a to 2c; and a heat sink plate 4. The LED substrates 2a to 2c, that is, substrates on which to mount LEDs, are arranged on the substrate 3 at particular intervals in the form of a single row or multiple rows. The heat sink plate 4 is attached to the bottom surface of the substrate 3. The connection among the LED substrates 2a to 2c, the substrates 3, and the heat sink plate 4 is made by thermally conductive resin 5 (e.g., silicone adhesive).

Each of the LED substrates 2a to 2c is structurally the same as the LED substrate 10 of FIG. 5. The LED substrates 2a to 2c each include a ceramic substrate 201, an LED chip 202, and wires 203. The ceramic substrate 201 has a square shape with the size of from 2 by 2 mm to 7 by 7 mm and with the thickness of 1.5 to 3 mm. The LED chip 202, that is, a light-emitting element, has a square shape with the size of from 0.2 by 0.2 mm to 2 by 2 mm and placed on the ceramic substrate 201. The wires 203 are used to connect some electrodes of the LED chip 202 to particular locations of the conductive wiring patterns on the ceramic substrate 201 (not illustrated in FIG. 1), which wiring patterns are made of more than 0.3-μm-high Au, Ag, Al, or other highly reflective metal.

The ceramic substrate 201 is high in thermal conductivity because it is made of alumina or aluminum nitride. Also, the ceramic substrate 201 has a concave portion on its top surface. The LED chip 202 is placed inside the concave portion with its bottom surface facing the ceramic substrate 201 (the bottom surface is the surface through which light is not emitted). In this case, the LED chip 202 is bonded to a particular portion of the conductive wiring patterns on the concave portion (see FIG. 5). The electrodes on the light-emitting-surface side of the LED chip 202 are connected by the wires 203 to particular locations of the conductive wiring patterns on the concave portion. Note that multiple LED chips 202 with different luminescent colors can also be placed on a single ceramic substrate 201 in place of a single LED chip 202.

As illustrated in FIG. 1, multiple ceramic substrates 201 are connected to the top surface of the substrate 3 by solder 32 and electrically conductive paste. This connection is made between the conductive wiring patterns on the substrate 3 (not illustrated in FIG. 1) that are used for supply of electric power to LED chips 202 and the conductive wiring patterns located on the bottom surfaces of the ceramic substrates 201 (not illustrated).

The substrate 3, which is 0.5 to 5 mm thick, is provided with multiple through holes 30, each of which is 0.5 to 2 mm in diameter. The through holes 30 are located near the ceramic substrates 201 so that the side faces of the ceramic substrates 201 can be sufficiently covered with the thermally conductive resin 5.

The heat sink plate 4, made of thermally conductive metal such as aluminum and copper, is glued by the thermally conductive resin 5 to the substrate 3 located above the heat sink plate 4.

The thermally conductive resin 5 is a thermoplastic resin or photo-plastic resin and made by mixing an insulating filler material, such as alumina, carbon, titanic oxide, and silica, with silicone resin or with epoxy-based resin. The thermal conductivity of the thermally conductive resin 5 is from 0.5 to 10 W/mK, its coefficient of thermal expansion is from 2 to 100 ppm/° C., and its viscosity rate is from 10 to 100 Pa·s. The thermally conductive resin 5 seals the bottom surfaces or part of the side surfaces of the ceramic substrates 201a to 201c and the through holes 30 of the substrate 3. Also, the thermally conductive resin 5 connects the substrate 3 and the heat sink plate 4 together.

Since the thermally conductive resin 5 is in contact with the bottom surfaces or part of the side surfaces of the ceramic substrates 201a to 201c, the thermally conductive resin 5 can transfer the heat of the ceramic substrate 201b, which tends to be high, to the ceramic substrates 201a and 201c, which are low in temperature. This reduces the temperature differences among the ceramic substrates 201a, 201b, and 201c. Thus, the temperature variations among the ceramic substrates 201a, 201b, and 201c also decrease. In fact, the structure of FIG. 1 resulted in a temperature difference of 3° C. or lower between the ceramic substrates 201a and 201b when a power of 2 W was applied to each LED, with the height h of the thermally conductive resin 5 from the top surface of the substrate 3 being set to about 1 mm. This temperature difference is lower than the difference obtained with the conventional structure of FIG. 6, which difference was 7° C.

When the above-mentioned height h is increased, the thermally conductive resin 5 can cover larger areas of the ceramic substrates 201a to 201c, which would result in achieving high efficiency of thermal transfer in transferring heat from the ceramic substrates 201a to 201c to the thermally conductive resin 5. As a result, the temperature difference between the ceramic substrates 201a and 201b can be reduced more.

Next, a manufacturing process of the LED light source 1 is described with reference to FIGS. 2A to 2C, which collectively illustrate a process for bonding the heat sink plate 4 to the substrate 3.

Figure 2A:
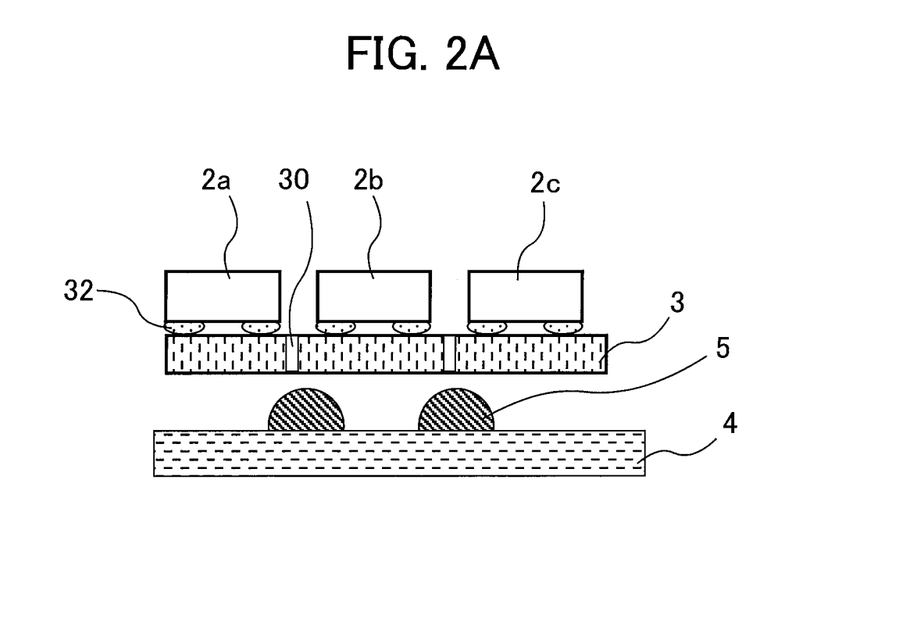
FIG. 2A illustrates a process for bonding a heat sink plate to a substrate according to Embodiment 1, particularly showing when a given amount of thermally conductive resin is applied to the heat sink plate.

As illustrated in FIG. 2A, the LED substrates 2a to 2c are placed on the substrate 3. The LED substrates 2a to 2c are self-aligned by reflow soldering. An adjusted amount of thermally conductive resin 5 is then applied onto the heat sink plate 4 with the use of a dispenser or the like.

Figure 2B:
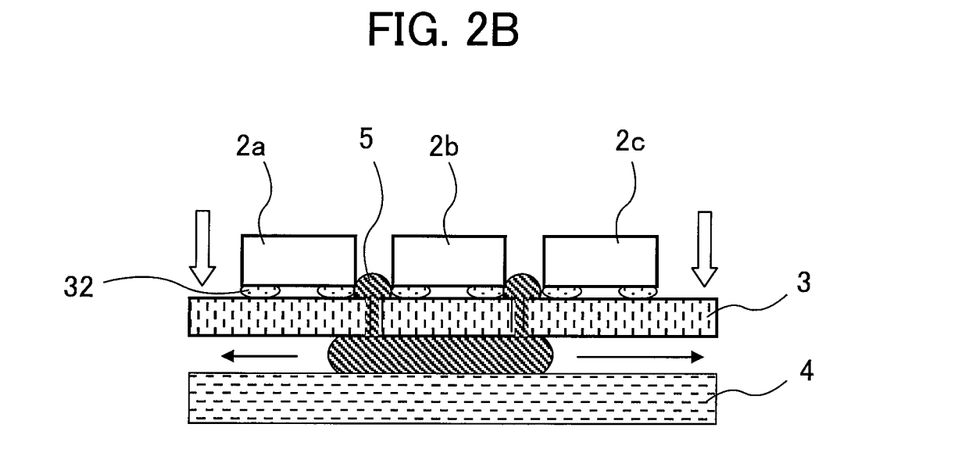
FIG. 2B illustrates the bonding process of Embodiment 1, particularly showing when the substrate is pressed against the heat sink plate so that the thermally conductive resin can be flattened by the heat sink plate and the substrate.

Then in FIG. 2B, after the substrate 3 is aligned with the heat sink plate 4, the substrate 3 is pressed against the heat sink plate 4 from above so as to connect the substrate 3 and the heat sink 4 by the thermally conductive resin 5. The pressure from above horizontally flattens the thermally conductive resin 5 located between the substrate 3 and the heat sink plate 4, with the conductive resin 5 spreading in the horizontal plane. The pressing is stopped after the distance between the substrate 3 and the heat sink plate 4 becomes a particular value.

Since the substrate 3 has the through holes 30 near the LED substrates 2a to 2c are placed, adding pressure causes the thermally conductive resin 5 to flow upward from the through holes 30.

Figure 2C:
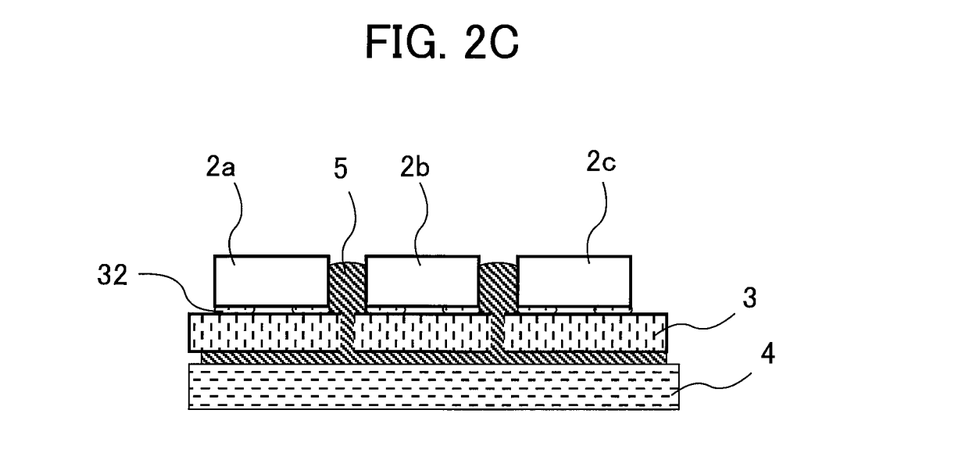
FIG. 2C illustrates the bonding process of Embodiment 1, particularly showing when the substrate is pressed further downward so that part of the thermally conductive resin can flow upward from the through holes of the substrate onto the top surface of the substrate.

Referring to FIG. 2C, by continuing to add pressure, the thermally conductive resin 5 existing between the substrate 3 and heat sink plate 4 flows through the through holes 30 to underneath the bottom surfaces or around the side surfaces of the LED substrates 2a to 2c to fill their associated spaces. This provides connection of the LED substrates 2a to 2c by the bottom surfaces and/or the side surfaces with the thermally conductive resin 5. An amount of thermally conductive resin flows through the through holes 30 to underneath the bottom surfaces or around the side surfaces of the LED substrates 2a to 2c shall be determined based on the following: the height of the thermally conductive resin 5 that flows upward from the through holes 30 is set so as not to exceed the heights of the LED substrates 2a to 2c.

Thereafter, the thermally conductive resin 5 is heated at about 150° C. for an hour for solidification. In solidifying, the thermally conductive resin 5 hardly changes in volume. Thus, the thermally conductive resin 5 will neither come off nor develop cracks. While we assume here that the thermally conductive resin 5 is a thermoplastic resin, a different solidification method (light curing or normal temperature leaving) has to be employed if the thermally conductive resin 5 is made of a different material such as a photo-plastic resin or the like. Because the manufacturing method described above is the same as conventional methods, there is no need to add a different bonding process and a different device. Thus, manufacturing cost increases can be prevented.

Further, since the thermally conductive resin 5 is allowed to flow upward from the through holes 30, there is no chance of the thermally conductive resin 5 fouling the light-emitting surfaces of the LED substrates 2a to 2c. This prevents the light intensity of their LED chips from dropping.

In addition, because the thermally conductive resin 5 is liquid, it can flow into small spaces. Thus, the thermally conductive resin 5 can be filled in the spaces between the LED substrates 2a to 2c on the substrate 3 even if the LED substrates 2a to 2c are closely spaced. Even in that case, high thermal conductivity is maintained because the thermally conductive resin 5 can sufficiently surround the LED substrates 2a to 2c, and the temperature differences among the LED substrates 2a to 2c can also be reduced.

Embodiment 2

Figure 3:
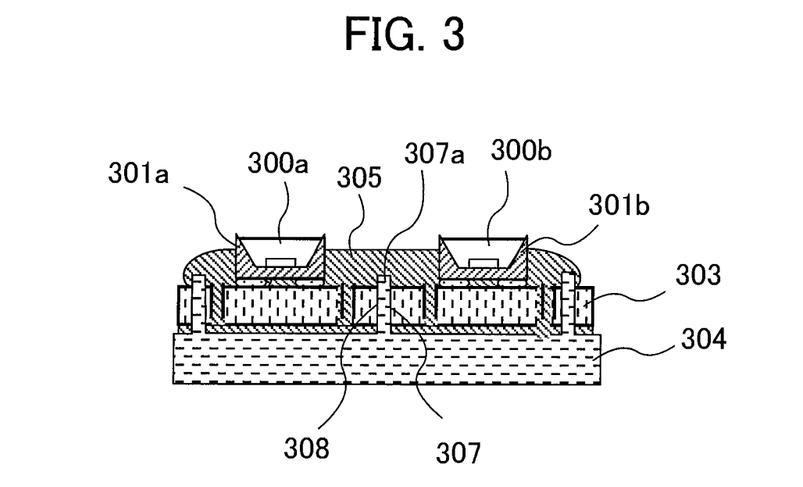
FIG. 3 is a cross section illustrating the structure of an LED light source according to Embodiment 2 of the invention.

FIG. 3 is a cross section of an LED light source according to Embodiment 2 of the invention. As illustrated, protrusions 307 are formed on the top surface of a heat sink plate 304, and alignment holes 308 are formed in a substrate 303 so that each of the protrusions 307 can be inserted into one of the alignment holes 308. By aligning the protrusions 307 with the alignment holes 308, the position of the heat sink plate 304 relative to the substrate 303 can be determined.

The height of each of the protrusions 307 is greater than the thickness of the substrate 303. Thus, the top ends 307a of the protrusions 307 protrude from the top surface of the substrate 303 on which ceramic substrates 301a and 301b (i.e., LED substrates 300a and 300b) are mounted.

By applying the same bonding process as illustrated in FIGS. 2A to 2C, thermally conductive resin 305 applied between the heat sink plate 304 and the substrate 303 flows upward from the through holes 309 of the substrate 303 and then flows onto the top surface of the substrate 303 on which the LED substrates 300a and 300b are mounted, as illustrated in FIG. 3. Thus, the thermally conductive resin 305 flowed onto the top surface of the substrate 303 contacts the bottom surfaces and/or the side surfaces of the LED substrates 300a and 300b and also the protrusions 307 of the heat sink plate 304.

In the above structure, the ceramic substrates 301a and 301b are connected to the heat sink plate 304 through the thermally conductive resin 305. Thus, the heat of the LED substrates 300a and 300b is transferred not only through the heat transfer path mentioned in Embodiment 1, but also from the side surfaces 301a and 301b of the LED substrates 300a and 300b through the protrusions 307 to the heat sink plate 304. Thus, the structure of Embodiment 2 is more effective in releasing the heat of the LED light source. In addition, the structure of Embodiment 2 is capable of reducing the temperature difference between the ceramic substrates 301a and 301b of the LED substrates 300a and 300b and reducing the temperatures of the ceramic substrates 301a and 301b as well.

Embodiment 3

Figure 4:
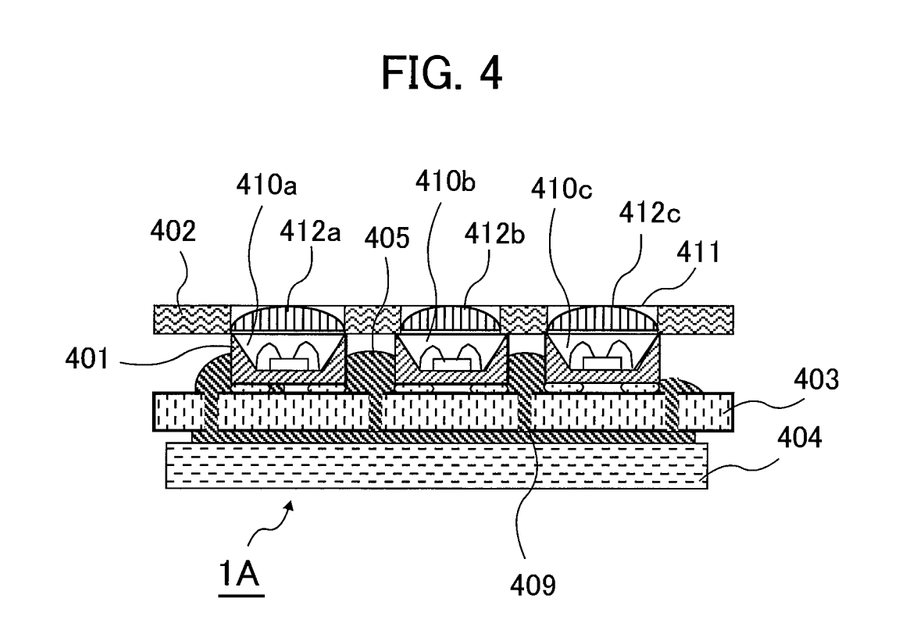
FIG. 4 is a cross section of an LED light source according to Embodiment 3 of the invention, which light source is intended for use in a photolithography apparatus.

FIG. 4 is a cross section of an LED light source according to Embodiment 3 of the invention, which light source is intended for use in a photolithography apparatus. The LED light source 1A of FIG. 4 differs from its counterparts of Embodiments 1 and 2 in that a lens substrate 402 is placed on the ceramic substrates 401 of LED substrates 410. The lens substrate 402 has windows 411, and a lens 412 is fit in each of the windows 411 in order to prevent light dispersion. Each of the lenses 412 is designed to convert radial light rays emitted from the LED substrates 410 into parallel ones.

Each of the lenses 412 has a transmittance of 50% or greater at the wavelength of the light from the LED substrates 410 and is molded from inorganic glass such as quartz or the like or from organic resin such as silicone resin, acrylic resin, or epoxy resin. The lenses 412 can be spherical lenses, aspherical lenses, or Fresnel lenses.

The LED light source 1A of FIG. 4 can be fabricated by a process similar to that of FIGS. 2A to 2C of Embodiment 1. To fabricate the LED light source 1A of Embodiment 3, the lens substrate 402 having the lenses 412 is first bonded to a substrate 403 on which the LED substrates 410 were mounted by reflow soldering. Then, the substrate 403 is aligned with and pressed against a heat sink plate 404 on which thermally conductive resin 405 was applied. The pressing causes the thermally conductive resin 405, now located between the heat sink plate 404 and the substrate 403, to flow via the through holes 409 of the substrate 403 onto the top surface of the substrate 403 (the top surface is the surface on which the LED substrates 410 are mounted). Thus, the thermally conductive resin 405 is supplied to contact with the bottom surfaces and/or the side surfaces of the ceramic substrates 401 of the LED substrates 410.

Thereafter, the assembly of the heat sink plate 404 and the substrate 403 is heated at about 150° C. for an hour for solidifying the thermally conductive resin 405. In solidifying, the thermally conductive resin 405 hardly changes in volume. Thus, the thermally conductive resin 405 will neither come off from the heat sink plate 404, the substrate 403, and the LED substrates 410 nor develop cracks therein. This prevents loss of heat transfer among the heat sink plate 404, the substrate 403, and the LED substrates 410.

It should be noted that the above-mentioned process of bonding the lens substrate 402 to the substrate 403 can instead be performed after the process of heating the assembly of the heat sink plate 404 and the substrate 403 for solidifying the thermally conductive resin 405.

Since the LED substrates 410 and the heat sink plate 404 are connected together by the thermally conductive resin 405, the heat of the LED substrates 410 can be released through the heat transfer path mentioned in Embodiment 1, which results in good heat release capabilities of the LED light source 1A. This in turn leads to small temperature variations among the ceramic substrates 401 of the LED substrates 410 as well as reduction in the temperatures of the ceramic substrates 401.

Note also that the lenses 412 to be fit in the windows 411 of the lens substrate 402 can be collimating lenses. In addition, as stated above, the presence of the lenses 412 inside the windows 411 as illustrated in FIG. 4 allows conversion of the light rays emitted from the LED substrates 410, which tend to disperse radially, into vertical ones with respect to an area to be illuminated (not illustrated). Thus, illumination light rays with uniform intensity can be obtained for the illumination area facing the LED light source.

Embodiment 4

Figure 11A:
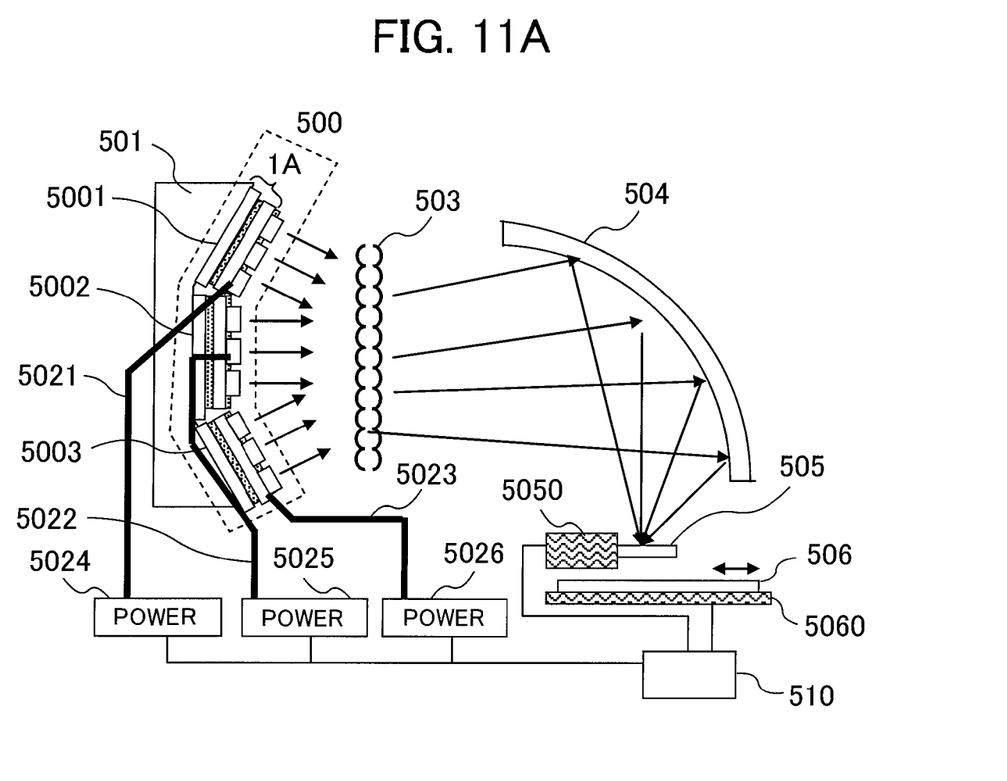
FIG. 11A illustrates the entire configuration of a photolithography apparatus according to Embodiment 4 of the invention.

FIG. 11A illustrates the configuration of a maskless photolithography apparatus according to Embodiment 4 of the invention in which LED light sources according to the invention are used.

As illustrated in FIG. 11A, the photolithography apparatus of Embodiment 4 includes the following components: an illumination system 500; an integrator 503; a collimating mirror 504; a pattern generation unit 505; a drive unit 5050 for driving the pattern generation unit 505; a table 5060 on which to place a workpiece 506 or a substrate to be irradiated; and a control unit 510 for controlling the drive unit 5050, the table 5060, and the illumination system 500.

The illumination system 500 that radiates light for lithography purposes includes multiple light sources 5001, 5002, and 5003, and these light sources 5001 to 5003 are all attached to a water-cooling jacket 501 for heat release purposes. The external wires of the light sources 5001, 5002, and 5003 are connected via harnesses 5021, 5022, and 5023 to power units 5024, 5025, and 5026, respectively.

The arrangements of the light sources 5001 to 5003 including their tilt angles with respect to the integrator 503 are designed such that the light emitted from the light sources 5001 to 5003 is incident on the integrator 503 efficiently. Although not illustrated in FIG. 11A, the light sources 5001 to 5003 and the integrator 503 extend in a direction vertical to the page on which FIG. 11A is shown.

The light sources 5001 to 5003 of the illumination system 500 are such LED light sources as described in Embodiments 1 to 3. Such light sources allow uniform illumination of a large area. Moreover, because the light sources 5001 to 5003 are capable of emitting light with substantially the same intensity with each other, they have substantially the same length of life, thereby extending the life of the illumination system 500.

In the above photolithography apparatus, the light emitted from the illumination system 500 passes through the integrator 503. The collimating mirror 504 then converges the light passed through the integrator 503, converting it into a linear shaped light ray, which is extending linearly along the lithography patterns formed on the pattern generation unit 505 (which is vertical to the page in FIG. 11A). The linear shaped light ray is projected on the pattern generation unit 505. The light passes through the lithography patterns formed on the pattern generation unit 505 is projected onto the workpiece 506 on which a photosensitive material (i.e., photoresist) is coated. By that, particular portions of the photoresist are exposed to the light, thereby transferring the patterns of the pattern generation unit 505 onto the photoresist coated on the workpiece 506 (For simplification purposes, FIG. 11A does not illustrate the optical focusing system of the photolithography apparatus).

During the pattern transfer onto the workpiece 506, the drive unit 5050 drives the pattern generation unit 505, and the control unit 510 moves the workpiece 506 placed on the table 5060 at a particular speed in a particular direction. The above photolithography apparatus can be the one disclosed, for example, in Patent Document 3.

Since the optical converging system of the photolithography apparatus of Embodiment 4 does not use a transmissive lens but uses the collimating mirror 504, it is free from chromatic aberration. The collimating mirror 504 also allows light exposure of smaller and shaper patterns when multi-wavelength light is used as the LED light source.

Figure 11B:
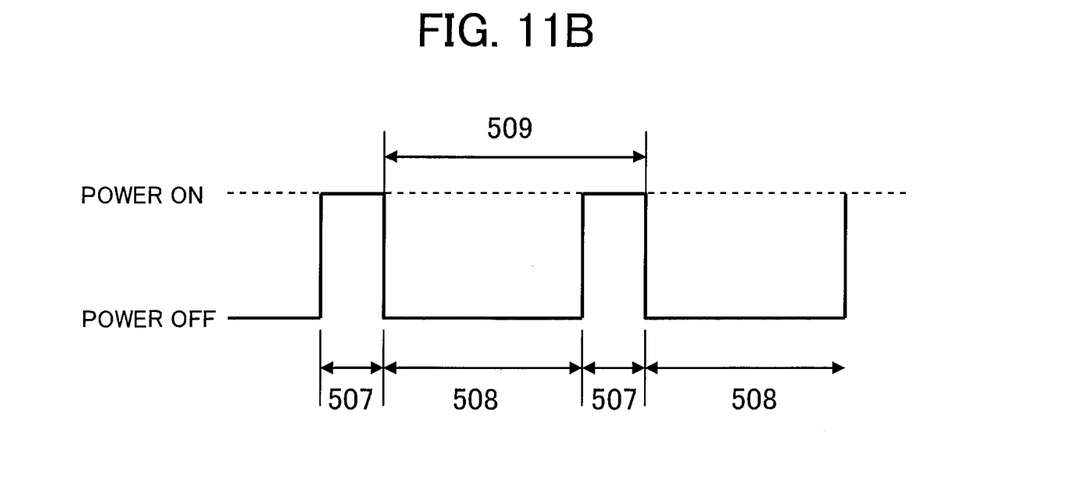
FIG. 11B is a graph showing light exposure conditions for the photolithography apparatus of Embodiment 4.

FIG. 11B illustrates light exposure conditions for the illumination system 500 of the above photolithography apparatus. The photolithography process generally includes the following steps: workpiece loading; fixation of the workpiece to a particular position; alignment of the workpiece with a mask; light exposure; unfastening of the workpiece; and unloading of the workpiece. The entire photolithography process often lasts 10 to 120 seconds, but the light exposure step lasts 5 to 60 seconds.

In a conventional photolithography apparatus that involves the use of a mercury lamp as its light source, the intensity of light from the lamp is unstable right after electric power is supplied to the lamp, which is due to temperature fluctuations of the lamp. It takes about thirty minutes for the light intensity to become stable. Accordingly, in using the conventional photolithography apparatus, its mercury lamp has to be kept turned on, so that the light intensity can be stabilized for light exposure. In case of using the LED light sources according to the invention, however, the light intensity stabilizes in a few milliseconds after power supply. Therefore, the LED light sources have only to be turned on during light exposure, which greatly reduces power consumption by the photolithography apparatus.

What is claimed is:

1. An LED light source, comprising:
a plurality of LED elements each of which is formed by connecting an LED chip to electrodes formed on a ceramic substrate;
an LED-mounting substrate on which to mount the plurality of LED elements, the LED-mounting substrate having through holes therein; and
a heat sink plate for releasing heat from the LED-mounting substrate;
wherein a thermally conductive resin is present between the LED-mounting substrate and the heat sink plate and
wherein part of the thermally conductive resin protrudes from the through holes of the LED-mounting substrate and covers the top surface of the LED-mounting substrate on which the plurality of LED elements are mounted, so that the part of the thermally conductive resin is in contact with the plurality of LED elements.

2. The LED light source of claim 1, wherein the LED chip is placed inside a concave portion of the ceramic substrate and wired to the electrode formed on the ceramic substrate.

3. The LED light source of claim 1, wherein the height of said part of the thermally conductive resin from the top surface of the LED-mounting substrate does not exceed the heights of the plurality of LED elements.

4. The LED light source of claim 1, further comprising lenses for preventing dispersion of light emitted from the plurality of LED elements.

5. The LED light source of claim 1, wherein the thermally conductive resin is higher in thermal conductivity than the LED-mounting substrate.

6. An LED-based photolithography apparatus, comprising:
a light source;
a photolithography pattern generation unit for generating photolithography patterns;
a table on which to place a workpiece, the table being movable at least in one direction; and
a control unit for controlling the light source, the photolithography pattern generation unit, and the table,
wherein the light source comprises:
a plurality of LED elements each of which is formed by connecting an LED chip to electrodes formed on a ceramic substrate;
an LED-mounting substrate on which to mount the plurality of LED elements, the LED-mounting substrate having through holes therein; and
a heat sink plate for releasing heat from the LED-mounting substrate, the heat sink plate being attached by a thermally conductive resin to the LED-mounting substrate; and
wherein part of the thermally conductive resin protrudes from the through holes of the LED-mounting substrate and covers the top surface of the LED-mounting substrate on which the plurality of LED elements are mounted, so that the part of the thermally conductive resin is in contact with the plurality of LED elements.

7. The LED-based photolithography apparatus of claim 6, wherein the photolithography pattern generation unit changes the shape of a pattern to be formed on the workpiece, based on the position of the workpiece that is moved by the table.

8. The LED-based photolithography apparatus of claim 6, wherein the light source further includes a water-cooling jacket for cooling the plurality of LED elements.

* * * * *